United States Patent
Pontius

(10) Patent No.: US 8,294,504 B2
(45) Date of Patent: Oct. 23, 2012

(54) METHODS AND SYSTEMS RELATED TO A CONFIGURABLE DELAY COUNTER USED WITH VARIABLE FREQUENCY CLOCKS

(75) Inventor: Timothy Allen Pontius, Crystal Lake, IL (US)

(73) Assignee: Synopsys, Inc., Mountain View, CA (US)

( * ) Notice: Subject to any disclaimer, the term of this patent is extended or adjusted under 35 U.S.C. 154(b) by 38 days.

(21) Appl. No.: 12/919,077

(22) PCT Filed: Feb. 27, 2009

(86) PCT No.: PCT/IB2009/050810
§ 371 (c)(1),
(2), (4) Date: Oct. 25, 2010

(87) PCT Pub. No.: WO2009/107105
PCT Pub. Date: Sep. 3, 2009

(65) Prior Publication Data
US 2011/0050313 A1    Mar. 3, 2011

(51) Int. Cl.
*H03H 11/26* (2006.01)
(52) U.S. Cl. ............... 327/286; 327/279; 377/49
(58) Field of Classification Search ............... 377/49, 377/51–52; 327/278–279, 285–286
See application file for complete search history.

(56) References Cited

U.S. PATENT DOCUMENTS

| | | | |
|---|---|---|---|
| 4,365,201 A | 12/1982 | Scott et al. | |
| 5,706,322 A * | 1/1998 | Scalo et al. | 377/20 |
| 5,744,992 A * | 4/1998 | Baumann | 327/241 |
| 6,044,412 A | 3/2000 | Evoy et al. | |
| 6,690,525 B2 * | 2/2004 | Ruegg et al. | 360/51 |
| 7,330,924 B1 | 2/2008 | Kao et al. | |
| 2007/0033337 A1 | 2/2007 | Butt et al. | |
| 2008/0304352 A1 | 12/2008 | Chen et al. | |

FOREIGN PATENT DOCUMENTS

EP    1521179 A1    4/2005

OTHER PUBLICATIONS

ISA/EPO, International Search Report dated Oct. 1, 2009 for PCT/IB2009/050810.
ISA/EPO, International Search Report dated Apr. 28, 2010 for PCT/IB2009/053873.
PCT International Search Report and Written Opinion, PCT Application No. PCT/IB2009/050810, Oct. 1, 2009, 9 pages.
PCT International Search Report and Written Opinion, PCT Application No. PCT/IB2009/053873, Apr. 28, 2010, 11 pages.

* cited by examiner

*Primary Examiner* — An Luu
(74) *Attorney, Agent, or Firm* — Fenwick & West LLP

(57) ABSTRACT

In certain arrangements and methods, a reset-able counter (100) produces multiple delay times as required by, for example, a finite state machine. The counter (100) counts a stored value by a configurable amount. That configurable amount is determined based upon the period of a clock cycle divided by a desired time unit. The value held by the counter does not represent a count of clock cycles, but rather a count of time units. In other aspects, a device generates fixed delays derived from a variable frequency input clock. The device includes a count circuit (100) and a comparator (114, 116). The number of time-units between consecutive clock edges of the input clock is stored, and the count circuit changes a current-count value by a corresponding amount, with the change being responsive to a clock edge of the input clock. The comparator (114, 116) compares the current-count value to a fixed value that represents a fixed delay time.

18 Claims, 3 Drawing Sheets

METHODS AND SYSTEMS RELATED TO A CONFIGURABLE DELAY COUNTER USED WITH VARIABLE FREQUENCY CLOCKS

The present invention relates generally to the use of delay counters, and in particular to a delay counter for use with a configurable clock.

Communication protocols, especially very low level protocols such as those which might be found in the Physical Layer (Phy) of a communication stack, are often implemented using one or more finite state machines (FSMs). For certain states in the FSM, the condition to move forward depends upon a certain time passing. If that time is based on a given number of clock periods (or bit times), the state machine simply counts to the appropriate fixed number before moving on. However, if that required time is a fixed time expressed in seconds (or a fraction thereof, such as 200 ns), then the state machine uses the clock frequency to determine how many clock cycles need to pass before advancing the state. If the clock frequency is fixed, this again becomes a rather straight forward problem to be solved. For example, if the clock is known to operate at 500 MHz (clock period=2 ns), the state machine might implement a counter which counts to 100 to determine when 200 ns have passed.

However, if the clock frequency is programmable (configurable), then the state machine becomes more complex. If only a few discrete frequencies are to be allowed, then the state machine can be designed to accommodate those frequencies, advancing the state when the appropriate limit has been reached. Continuing the example described above, if 500 MHz, 250 MHz, and 100 MHz are the only three choices, the condition for advancing the state machine might be written as (clk500=true && counter=100)||(clk250=true && counter=50)||(clk100=true && counter=20) where && indicates a logical AND operation and || indicates a logical OR operation.

If the frequency is allowed to be any value within some range, the discrete approach presented above is not practical. This problem can be solved by implementing a programmable register which is compared to the counter value. Software must program this register appropriately for the given frequency. For example, if the frequency is configured to be 500 MHz, the limit register could be programmed to a value of 100. If the frequency is 250 MHz, the limit register might be programmed to 50. And if the frequency is 400 MHz (not one of the originally considered discrete frequencies), the register can be programmed to 80.

Comparators that must check against arbitrary values typically require either a full comparator, which can be implemented with exclusive OR gates, or a subtractor to detect greater-than-or-equal. For applications that use a large count value and a correspondingly large number of bits, implementing such comparison logic begins to require a prohibitive amount of logic.

Aspects of the present invention are directed to arrangements and approaches for a configurable counter for use with a plurality of different clock frequencies.

According to a particular example embodiment, the present invention involves use of a reset-able counter that produces multiple delay times as required by, for example, a FSM (finite state machine). The counter increments/decrements (counts) a stored value by a configurable amount. That configurable amount is determined based upon the period of a clock cycle divided by a desired time unit. Thus, the value held by the counter does not represent a count of clock cycles, but rather a count of time units.

According to another particular example embodiment, the present invention is directed to a device for generating fixed delays derived upon a variable frequency input clock. The device includes a memory, a count circuit and a comparison circuit. The memory is for storing a value that represents a number of time-units between consecutive clock edges of the input clock. The count circuit changes a current-count value by an amount corresponding to the stored value, the change being responsive to receiving a clock edge of the input clock. The comparison circuit compares the current-count value to a fixed value, wherein the fixed value represents a fixed delay time. In some implementations, the comparison circuit performs a greater than or equal comparison between the fixed value and the current-count value.

According to another particular example embodiment, the present invention involves a method for generating fixed delays derived upon a variable frequency input clock. The method includes: storing, in a memory, a count-by value that represents a number of time-units between consecutive clock edges of the input clock; changing a current-count value by an amount corresponding to the count-by value in response to receiving a clock edge of the input clock; comparing the current-count value to a fixed value, wherein the fixed value represents a fixed-delay time; and implementing an action in response to the comparison.

The above summary is not intended to characterize each example embodiment presented in the detailed description.

The invention may be more completely understood in consideration of the following detailed description of various embodiments of the invention in connection with the accompanying drawings, in which.

Figure 1:
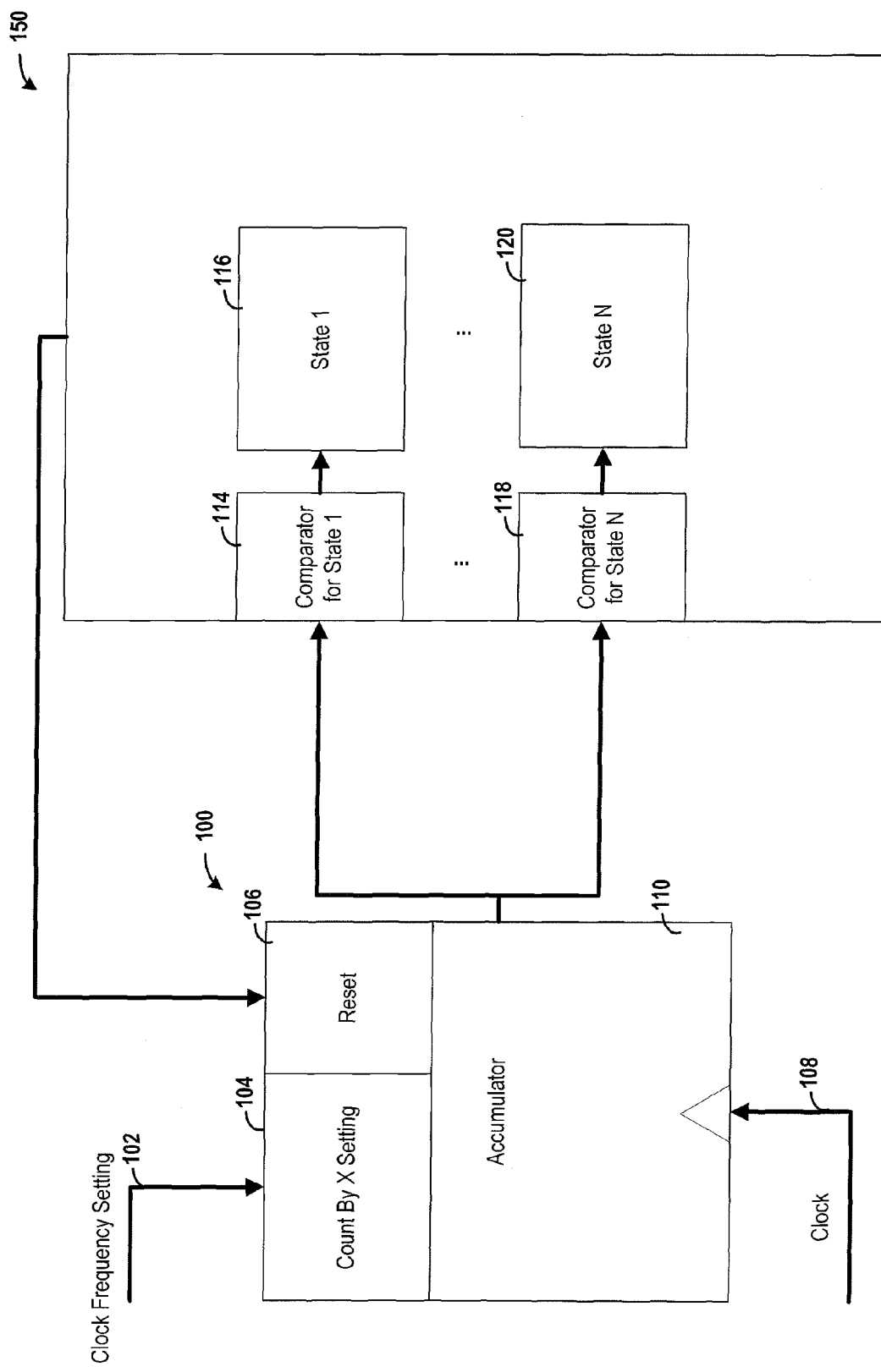
FIG. 1 shows a block diagram of a system implemented according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

The present invention is believed to be applicable to a variety of arrangements and approaches for a configurable counter for use with a plurality of different clock frequencies. While the present invention is not necessarily limited to such applications, an appreciation of various aspects of the invention is best gained through a discussion of examples in such an environment.

According to an example embodiment of the present invention, a single reset-able counter is implemented. The counter is used to produce multiple delay times as required by, for example, a FSM (finite state machine). The counter increments/decrements (counts) a stored value by a configurable amount. That configurable amount is determined based upon the period of a clock cycle divided by a desired time unit. Thus, the value held by the counter does not represent a count of clock cycles, but rather a count of time units.

For example, assume the desired time unit is a single nanosecond, and the (configurable) clock frequency is 200 MHz. One clock cycle at 200 MHz takes 5 ns. The counter would be configured to count by 5 (i.e., 5 ns/1 ns). This can be accomplished by adding 5 to the counter value each clock cycle. To measure a time of 400 ns, the FSM would wait until the counter value reaches (or exceeds) 400. At 200 MHz, this will require 80 clock cycles (400/5=80). Each of those 80 clock cycles will add 5 to the counter, which when starting from 0 will reach 400 after 80 clocks.

Using the same hardware described above, except with a 125 MHz clock, the increment value is configured to add 8 to the counter each clock cycle (i.e., 8 ns per clock cycle). In such an example, the counter will reach a value of 400 after only 50 clock cycles. Note that 50 clock cycles at 125 MHz is 400 ns, and thus, the count accurately represents the time delay.

This same timeout counter and configured value (5 for 200 MHz, 8 for 125 MHz, etc) can be used for multiple delay times used by the FSM. For instance, one state might wait for the counter value to reach 400. Another state might wait for the counter value to reach only 200 (i.e., for a 200 ns delay). The counter itself, and the single configuration parameter can be used for multiple states, each having independent delays.

For some combinations of clock frequencies and timeout values, the value in the counter might not land on the exact timeout desired. For such combinations, the timeout check can be implemented using a "greater-than-or-equal" type of comparison. For example, suppose a delay of 300 ns is needed using the two example clock frequencies given above. When the clock frequency is 200 MHz the count is by 5 and 300 ns is reached after 60 clock cycles. However, when the clock frequency is 125 MHz, the count is by 8. After 37 clock cycles, the counter value will be 296, and after clock cycle 38, the counter value will be 304. Thus, the counter value never reaches exactly 300; however, 304 passes a greater-than-or-equal test when compared to 300, so the timeout can be considered finished.

Similarly, some frequencies cannot be represented as having a clock period with an integer number of nanoseconds. For example, consider an 80 MHz clock with a clock period of 12.5 ns. If it is important that the delay never be too short, the configured counter increment could be set to 12. Then when a 200 ns delay is required, and the counter is incrementing by 12, the counter value would reach 204 after 17 clock cycles. At 80 MHz (12.5 ns period), 17 clock cycles represent 212.5 ns.

To minimize these errors, the units represented by the timeout counter can be set to something other than nanoseconds. An example of such a change would be to represent picoseconds (ps), which are 1000 times smaller than a nanosecond. When using picoseconds and a 200 MHz clock, the increment value would be 5000 instead of 5. For 125 MHz, the increment would be 8000, and for 80 MHz, the increment would be 12500. The target value for a 400 ns delay then becomes 400,000 (400,000 ps=400 ns).

A trade-off can be made between accuracy and hardware resources. For example, instead of changing the count value to represent picoseconds (adding approximately 10 bits to the counter), another approach can be to change the counter value to represent 0.25 ns (adding only 2 bits to the counter). This reduces the maximum error for each clock cycle to less than 0.25 ns. The target values would then be represented as a count of 0.25 ns increments. For example, a 200 ns delay would wait for the counter value to reach or exceed 800 (200/0.25=800). Using the 80 MHz example, the counter would increment by 50 each cycle (80 MHz=12.5 ns per clock). 12.5 ns per clock/0.25 ns per count=50 counts per clock). After 16 clock cycles, the counter will reach 800, indicating 200 ns have elapsed.

FIG. 1 shows a block diagram of a system implemented according to an embodiment of the present invention. Counter 100 provides a count value to logic circuit 150. In a specific example, logic circuit 150 is a FSM. Clock signal 108 determines the frequency at which counter 100 increments (or decrements) the count value. Clock frequency setting 102 represents a numerical value that is stored in a memory as represented by the count-by-X setting 104. Accumulator 110 increments or decrements the current count by the amount of setting 104 on each occurrence of a clock event from clock signal 108. A clock event could be represented by one or both of a negative or positive edge of the clock signal 108. Reset 106 sets the current count value to a known value (e.g., zero).

Logic circuit 150 receives the count value from accumulator 110. This value is compared to one or more delay values using comparators 114, 118. The result of the comparison can be used by logic circuit 150. For the example where logic circuit 150 is a FSM, states 116 and 120 use respective comparison results as a condition in the FSM. By setting the appropriate count-by-x setting 104, the comparators 114, 118 can be optimized to compare the received count to a single value independent of the frequency of clock signal 108. This can be particularly useful for implementing the comparators that are optimized according to the single comparison value.

The count-by-X setting 104 can be set using a variety of different methods and systems. In one instance, the count-by-X setting is determined during an initial configuration of the device. This can be done, for example, during manufacturing of a device that includes the count circuit. A non-exclusive list of storage mechanisms includes non-volatile memory (e.g., eprom), component loading options (e.g., resistors loaded according to the desired frequency), cut-able traces, or fuses. In this instance, the count-by-X setting is determined by a user of the count circuit. The user can be an Original-Equipment-Manufacture (OEM) who uses a circuit board or integrated-circuit chip that includes the count circuit. In yet another instance, the count-by-X setting is dynamically adjustable. This can be implemented, for example, using processing logic that writes data representing the count-by-X setting to memory, which can be a volatile memory.

In a specific embodiment, the counter is implemented for use in the PHY of a communication stack that is designed to operate with a configurable clock frequency and fixed time delays (i.e., not contingent on the clock frequency). For a dynamically adjustable clock, a software driver can be configured to set the count-by-X setting as the clock frequency is adjusted. For a relatively static clock (e.g., a clock frequency determined by the OEM user of a circuit that implements the PHY and counter) the count-by-X setting can be set once. This can be particularly useful for facilitating the implementation of a product that is useable over a large number of different clock frequency settings.

Figure 2:
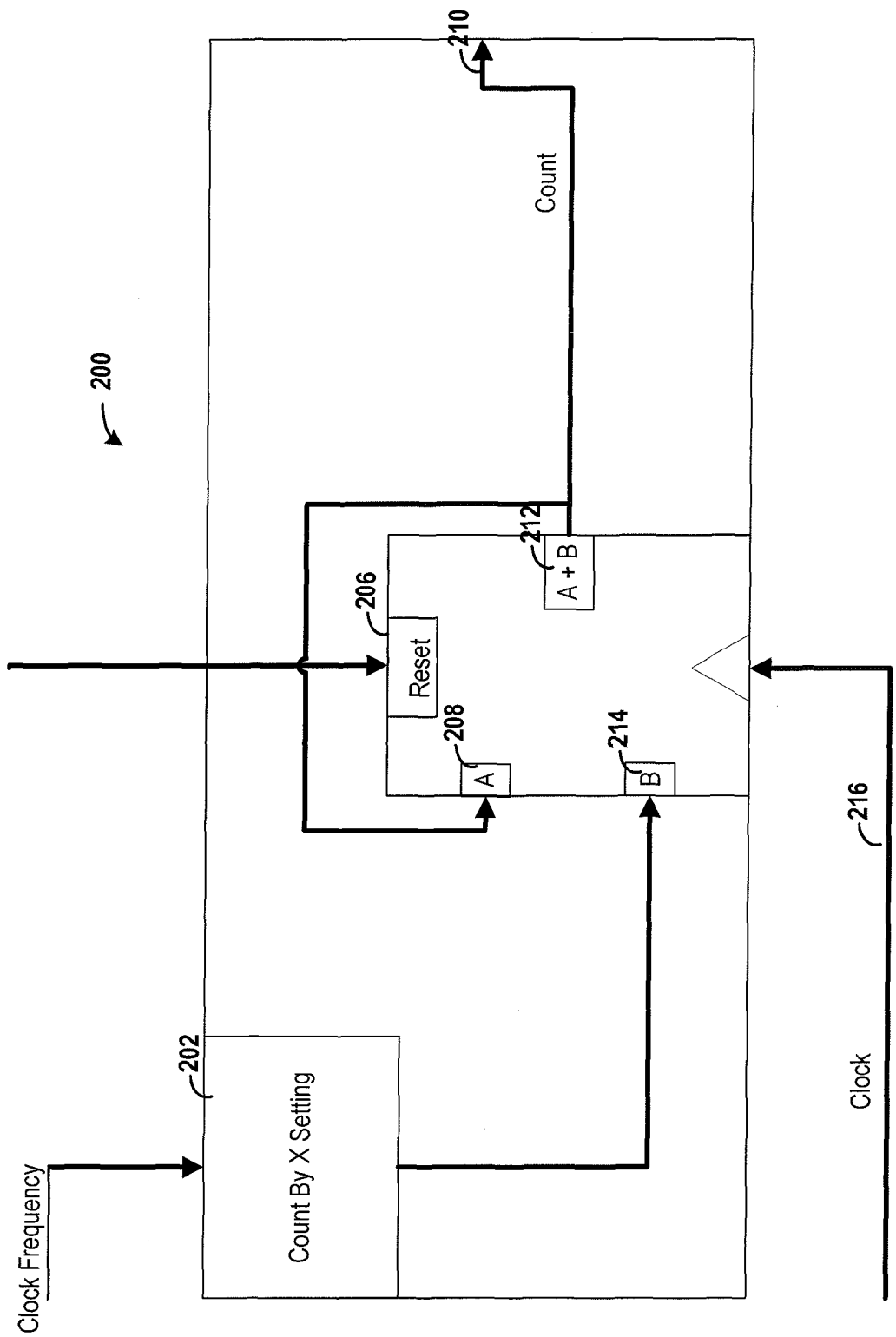
FIG. 2 shows a configurable positive-going counter, according to an example embodiment of the present invention.

FIG. 2 shows a configurable positive-going counter, according to an example embodiment of the present invention. Counter 200 includes inputs for clock 216, count-by-X setting 202 and reset 206. Counter 200 outputs count 210. Count 210 is the output resulting from an addition of components A (208) and B (214). Component B is equal to the count-by-X setting 202. Component A is equal to the previous count 210. Reset 206 resets the current count value to a known quantity (e.g., zero).

An example embodiment is consistent with the following functionality. The clock frequency is determined to be 200 MHz and the desired count value is ns. The count-by-X setting 202 is set to 5. The reset is released when the count is to begin. The count value begins at a known value, which can be zero. Assuming count output starts at zero, the count output transitions from 0 to 5 (0+5) after the first clock event. After the second clock event, the count output transitions from 5 to 10 (5+5). This sequence continues until the reset 206 is applied.

Figure 3:
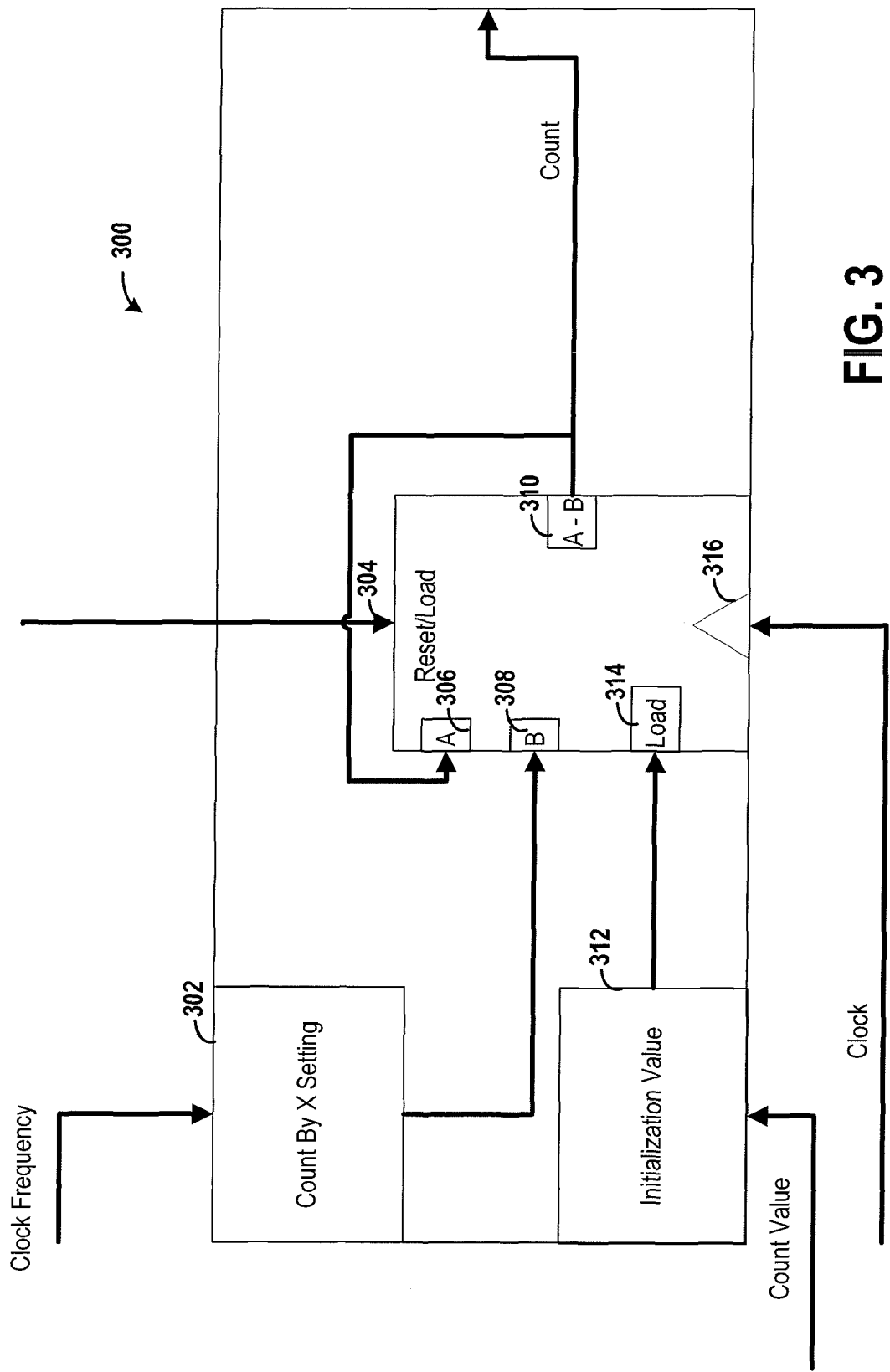
FIG. 3 shows a configurable negative-going counter, according to an example embodiment of the present invention.

FIG. 3 shows a specific embodiment of a configurable negative-going counter, according to an example embodiment of the present invention. Counter 300 includes inputs for clock 316, count-by-X setting 302, reset/load 304 and initialization value 312. Count 310 is an output that results from the subtraction of component B (308) from component A (306).

The initialization value can be set in much the same methods discussed in connection with the count-by-X setting. Reset/load 304 input determines when the count is to begin. When the count begins, the initialization value becomes the current count value. For each subsequent clock event, the current count value is decremented by the count-by-X setting. In this manner the count value counts down from the initialization value.

In a system that uses only one time-delay, the count down mechanism may be preferable as the comparator can simply look for a negative (or zero) value. In a system that uses multiple time-delays, the initialization value can be dynamically set for the different time-delays. Thus, the initialization value can be set according to the specific time-delay by, for example, a software driver that controls the communications (e.g., a driver for controlling Phy-based communications).

A specific embodiment of the present invention is particularly useful for mobile communications devices, such as cellular phones. In one instance a counter is implemented for delays in the communication Phy of the mobile device. The Phy can include, for example, a wide-area-network (WAN) interface sublayer (WIS), as may be implemented in connection with a device that is consistent with UniPhy.

While the present invention has been described above and in the claims that follow, those skilled in the art will recognize that many changes may be made thereto without departing from the spirit and scope of the present invention.

What is claimed is:

1. A device for generating a signal indicative of a fixed delay of time based on an input clock with a variable frequency, the device comprising:
    a memory configured to store a count-by value representing a number of predetermined time-units between a first edge of the input clock in a first cycle and a second edge corresponding to the first edge of the input clock in a second cycle subsequent to the first cycle;
    a count circuit, coupled to receive the count-by value from the memory, the count circuit configured to increase or decrease a count-value output by the received count-by value responsive to receiving the second edge of the input clock; and
    a comparison circuit, coupled to receive the count-value from the count circuit, the comparison circuit configured to determine lapse of the fixed delay of the time by comparing the count-value to a fixed value corresponding to the fixed delay of time.

2. The device of claim 1, wherein the comparison circuit is further configured to generate an output signal indicating the lapse of the fixed delay of time responsive to determining that the count value is greater than or equal to the fixed value.

3. The device of claim 1, wherein the comparison circuit is part of a finite state machine.

4. The device of claim 1, wherein the count circuit is further configured to receive a reset input signal for resetting the count-value to an initial value.

5. The device of claim 4, further including an initialization memory for storing the initial value, wherein the count circuit is configured to read the initial value from the initialization memory in response to receiving the reset input.

6. The device of claim 1, wherein the count circuit is further configured to receive a load input signal for initializing the count-by value to an adjustable value.

7. The device of claim 6, wherein the count circuit subtracts the count-by value from the count-value responsive to receiving the second edge of the input clock.

8. The device of claim 1, wherein the count circuit adds the count-by value to the count-value responsive to receiving the second edge of the input clock.

9. A method for generating a signal indicative of a fixed delay of time based on an input clock with a variable frequency, the method comprising:
    storing, in a memory, a count-by value representing a number of predetermined time-units between a first edge of the input clock in a first cycle and a second edge corresponding to the first edge of the input clock in a second cycle subsequent to the first cycle;
    increasing or decreasing a count-value output by the count-by value received from the memory in response to receiving the second edge of the input clock;
    determining lapse of the fixed delay of time by comparing the count-value to a fixed value corresponding to the fixed delay of time; and
    implementing an action in response to the comparison.

10. The method of claim 9, further including the step of comparing the count-value to another fixed value corresponding to another fixed delay of time different from the fixed delay of time.

11. The method of claim 9, wherein a software driver determines and stores the count-by value.

12. The method of claim 11, wherein the memory is a volatile memory circuit.

13. The method of claim 9, wherein the memory is a non-volatile memory circuit.

14. A system for generating a signal indicative of a fixed delay of time based on an input clock with a variable clock frequency, the system comprising:
    a memory configured to store a count-by value representing a number of predetermined time-units between a first edge of the input clock in a first cycle and a second edge corresponding to the first edge of the input clock in a second cycle subsequent to the first cycle;
    a count circuit, coupled to receive the count-by value from the memory, the count circuit configured to increase or decrease a count-value output by the received count-by value responsive to receiving the second edge of the input clock; and
    a finite state machine coupled to the count circuit and having conditional arguments that depend upon lapse of the fixed delay of time determined by comparing the count-value to a fixed value corresponding to the fixed delay of time.

15. The system of claim 14, wherein the state machine is configured to generate an output signal indicating the lapse of the fixed delay of time responsive to determining that the count value is greater than or equal to the fixed value.

16. The system of claim 14, wherein the count circuit is further configured to receive a reset input signal for resetting the count-value to an initial value.

17. The system of claim 14, wherein the count circuit is further configured to receive a load input signal for initializing the count-by value to an adjustable value.

18. The system of claim 14, wherein the count circuit subtracts the count-by value from the count-value responsive to receiving the second edge of the input clock.

* * * * *